(12) United States Patent
Iguchi et al.

(10) Patent No.: US 8,395,055 B2
(45) Date of Patent: Mar. 12, 2013

(54) SUSPENSION BOARD WITH CIRCUIT

(75) Inventors: Hirotoshi Iguchi, Osaka (JP); Tetsuya Ohsawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 598 days.

(21) Appl. No.: 12/289,181

(22) Filed: Oct. 22, 2008

(65) Prior Publication Data

US 2009/0101399 A1 Apr. 23, 2009

Related U.S. Application Data

(60) Provisional application No. 60/996,113, filed on Nov. 1, 2007.

(30) Foreign Application Priority Data

Oct. 23, 2007 (JP) ................. 2007-275536

(51) Int. Cl.
*H05K 1/11* (2006.01)
(52) U.S. Cl. .................... 174/261; 174/254
(58) Field of Classification Search .............. 174/254, 174/260–262; 361/685, 748
See application file for complete search history.

(56) References Cited

U.S. PATENT DOCUMENTS

| 5,202,803 | A | * | 4/1993 | Albrecht et al. ........... 360/99.18 |
| 5,680,275 | A | * | 10/1997 | Frater et al. ................. 360/234.5 |
| 7,006,331 | B1 | * | 2/2006 | Subrahmanyam et al. 360/245.9 |
| 7,142,395 | B2 | * | 11/2006 | Swanson et al. ............ 360/245.9 |
| 2005/0141138 | A1 | * | 6/2005 | Shiraishi et al. ........... 360/234.5 |
| 2006/0187584 | A1 | | 8/2006 | Watanabe |
| 2006/0203389 | A1 | * | 9/2006 | Motonishi .................. 360/234.6 |
| 2009/0101399 | A1 | * | 4/2009 | Iguchi et al. .................. 174/260 |
| 2010/0195251 | A1 | * | 8/2010 | Nojima et al. ............. 360/245.3 |
| 2011/0048771 | A1 | * | 3/2011 | Satomi et al. ................. 174/254 |

FOREIGN PATENT DOCUMENTS

| JP | 10-3633 | 1/1998 |
| JP | 10-027447 | 1/1998 |
| JP | 11-039627 | 2/1999 |
| JP | 2006-236449 | 9/2006 |

* cited by examiner

*Primary Examiner* — Yuriy Semenenko
(74) *Attorney, Agent, or Firm* — Jean C. Edwards, Esq.; Edwards Neils PLLC

(57) ABSTRACT

A suspension board with circuit includes a slider mounting portion provided with three pedestals arranged in mutually spaced apart relation for supporting a slider on which a magnetic head is mounted.

9 Claims, 4 Drawing Sheets

(a)

(b)

(a)

(b)

(c)

(d)

SUSPENSION BOARD WITH CIRCUIT

CROSS-REFERENCE TO RELATED APPLICATIONS

This patent application claims the benefit of U.S. Provisional Application No. 60/996,113, filed on Nov. 1, 2007, and claims priority from Japanese Patent Application No. 2007-275536, filed on Oct. 23, 2007, the contents of which are herein incorporated by reference in their entirety.

BACKGROUND OF THE INVENTION

1. Field of the Invention

The present invention relates to a suspension board with circuit and, more particularly, to a suspension board with circuit used in a hard disk drive.

2. Description of the Related Art

Conventionally, a magnetic head has been mounted on a suspension board with circuit used in a hard disk drive. Typically, a slider mounting portion for mounting a slider on which the magnetic head is mounted is formed at the front end portion of the suspension board with circuit.

For example, it is proposed that a bonding surface for bonding to a slider substrate is formed at the front end portion of a suspension, and four rod-shaped spacers having the same thickness are provided at the peripheral end portion of the bonding surface to form a rectangular frame shape surrounding the inner portion of the bonding surface (see, e.g., Japanese Unexamined Patent No. 10-27447). In Japanese Unexamined Patent No. 10-27447, the spacers are provided, and then brought into contact with the slider substrate to support it.

SUMMARY OF THE INVENTION

However, when the upper surfaces of the four spacers are not positioned in the same plane in the suspension proposed in Japanese Unexamined Patent No. 10-27447, the slider substrate placed on the spacers wobbles, which leads to the problem that the floating position (angle) of the slider substrate cannot be precisely adjusted.

It is therefore an object of the present invention to provide a suspension board with circuit which allows a slider to be supported in a stable position, and allows the slider to be maintained in a steady floating position (angle).

A suspension board with circuit of the present invention includes a slider mounting portion provided with three pedestals arranged in mutually spaced apart relation for supporting a slider on which a magnetic head is mounted.

Since the suspension board with circuit is provided with the three pedestals, the slider can be supported at three points by these pedestals. This allows the slider to be supported in a stable position. As a result, it is possible to maintain the slider in a steady floating position (angle).

In the suspension board with circuit of the present invention, it is preferable that each of the pedestals is formed by electrolytic plating.

When the pedestals are formed by electrolytic plating, the formed pedestals may have different thicknesses when current densities in the respective pedestals are different.

However, in the suspension board with circuit, even when the pedestals formed by electrolytic plating have different thicknesses, the slider can be supported in a stable position by three-point mounting.

In addition, since the three pedestals are provided in spaced-apart relation in the suspension board with circuit, the pedestals having the same thickness can be formed by electrolytic plating.

It is preferable that the suspension board with circuit of the present invention further includes a terminal portion disposed adjacent to the slider mounting portion to electrically connect to the magnetic head, wherein the pedestals include two proximate pedestals which are proximate to the terminal portion, and a distant pedestal which is distant from the terminal portion.

In the suspension board with circuit, when the slider is mounted on the pedestals, and the magnetic head is further mounted on the slider to electrically connect the terminal portion and a terminal portion of the magnetic head, the position of the connection terminal of the magnetic head with respect to the terminal portion can be more stabilized with the two proximate pedestals which are proximate to the terminal portion. This allows more precise connection between the terminal portion and the connection terminal of the magnetic head. As a result, connection reliability can be improved.

In the suspension board with circuit of the present invention, it is preferable that each of the proximate pedestals is disposed on a straight line extending in a direction perpendicular to a direction in which the slider mounting portion and the terminal portion are adjacently arranged, and the distant pedestal is disposed between straight lines each extending along the direction in which the slider mounting portion and the terminal portion are adjacently arranged so as to traverse the respective proximate pedestals.

In the suspension board with circuit, the magnetic head is disposed at an optimum position to allow efficient stabilization of the floating position of the slider.

DETAILED DESCRIPTION OF THE INVENTION

Figure 1:
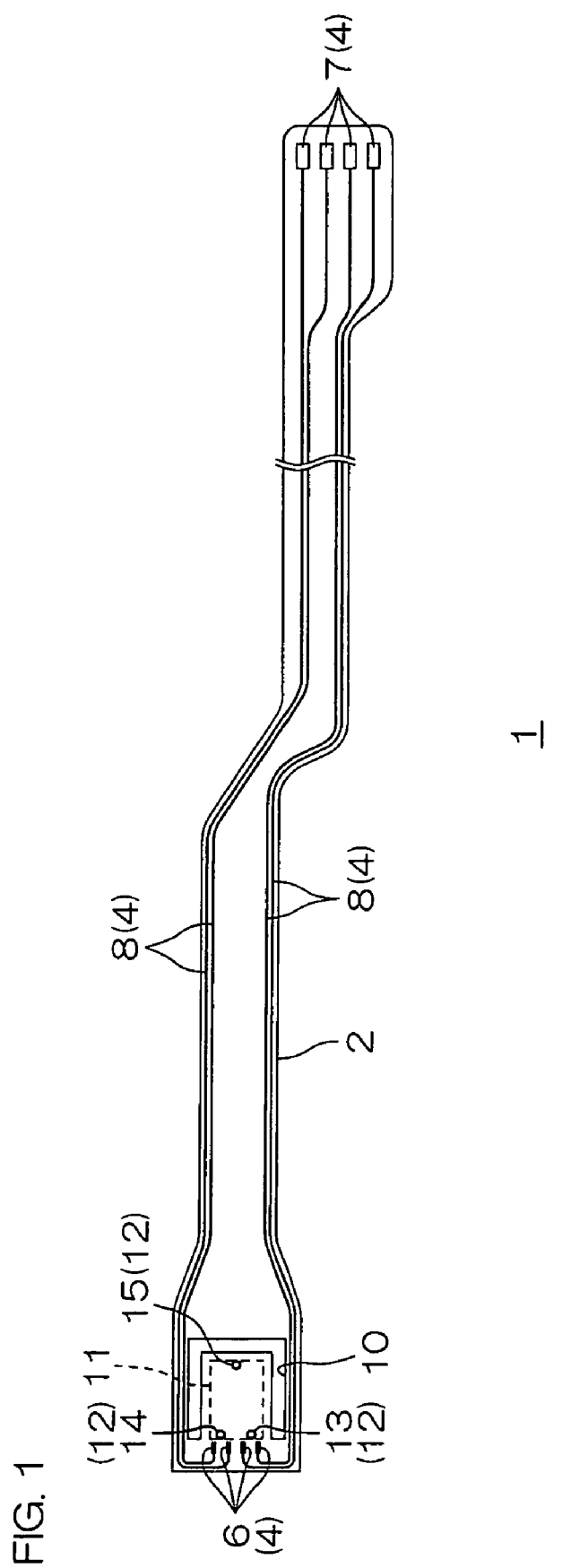
FIG. 1 is a plan view of a suspension board with circuit according to an embodiment of the present invention.
Figure 2:
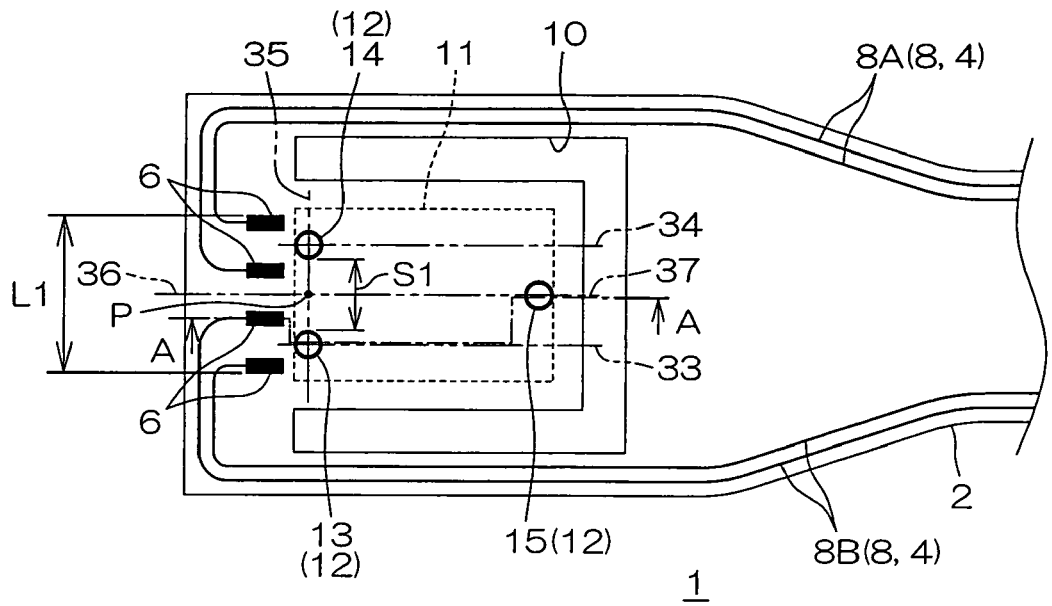
FIG. 2 is an enlarged plan view of the front end portion of the suspension board with circuit shown in FIG. 1.
Figure 3:
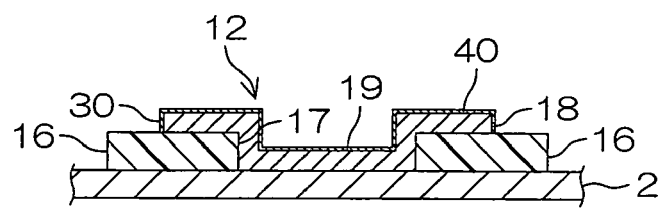
FIG. 3 is an enlarged view of each of pedestals provided at the front end portion shown in FIG. 2,
  (a) showing a cross-sectional view, and
  (b) showing a plan view.
Figure 4:
FIG. 4 is a process view showing a producing method of the suspension board with circuit shown in FIG. 1,
  (a) showing the step of preparing a metal supporting board,
  (b) showing the step of simultaneously forming an insulating base layer and a pedestal insulating base layer,
  (c) showing the step of simultaneously forming a conductive pattern and a pedestal conductive layer, and
  (d) showing the step of forming a cut-out portion.
Figure 4:
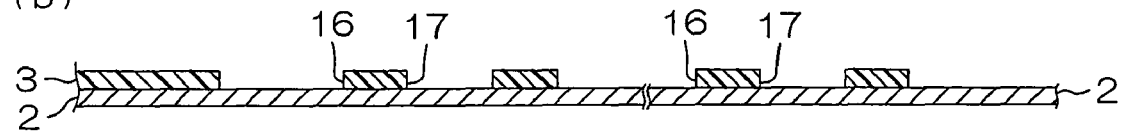
Figure 4:
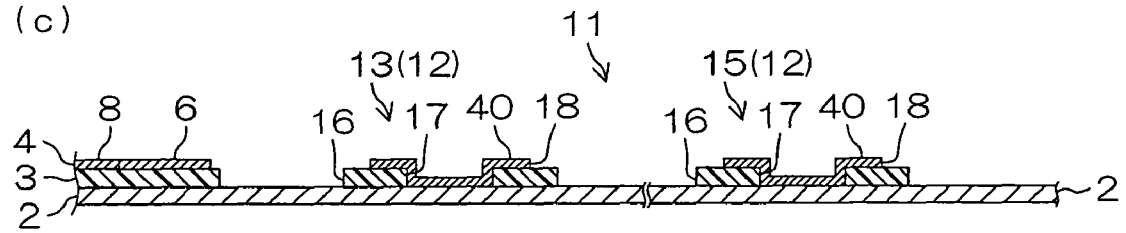
Figure 4:
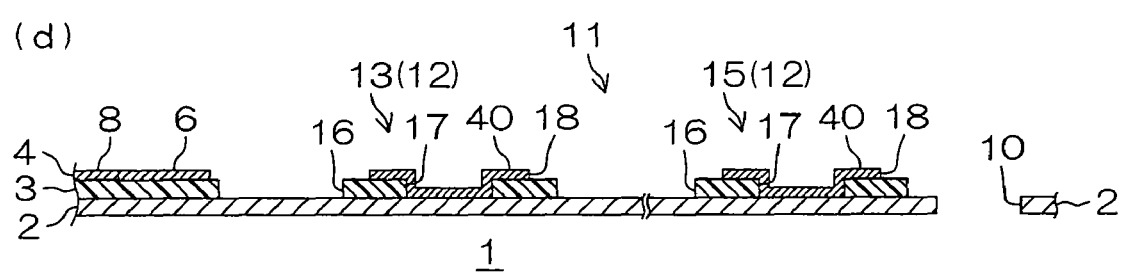
Figure 5:
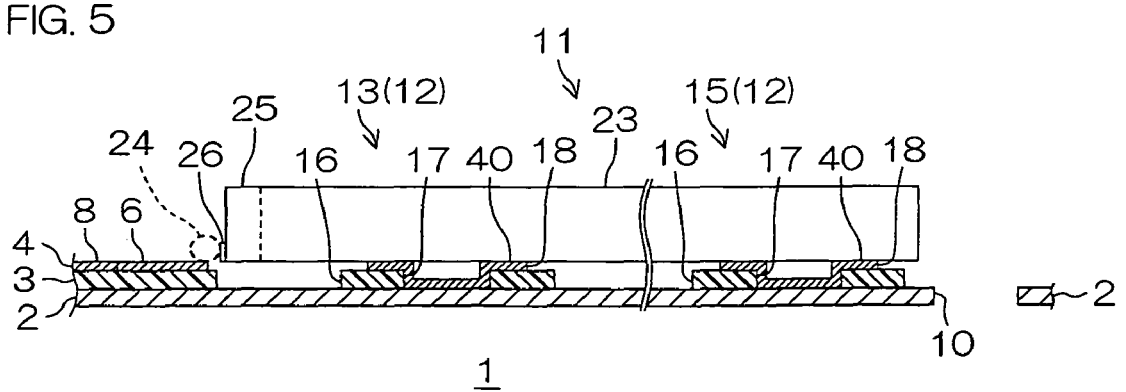
FIG. 5 is a cross-sectional view showing a state where a slider is mounted on the suspension board with circuit shown in FIG. 1.

FIG. 1 is a plan view of a suspension board with circuit according to an embodiment of the present invention. FIG. 2 is an enlarged plan view of the front end portion of the suspension board with circuit shown in FIG. 1. FIG. 3 is an enlarged view of each of pedestals provided at the front end portion shown in FIG. 2, (a) showing a cross-sectional view, and (b) showing a plan view. FIG. 4 is a process view showing a producing method of the suspension board with circuit shown in FIG. 1. FIG. 5 is a cross-sectional view showing a state where a slider is mounted on the suspension board with circuit shown in FIG. 1. In FIGS. 1 and 2, an insulating base layer 3 and an insulating cover layer, each described later, are omitted for clear illustration of relative positioning of a conductive pattern 4. In FIG. 3(b) also, metal plating layers 30 described later are omitted for clear illustration of relative positioning of a pedestal conductive layer 18.

In FIG. 1, in a suspension board with circuit 1, the conductive pattern 4 is formed integrally on a metal supporting board 2 extending in a longitudinal direction, and supported thereby to electrically connect a magnetic head (see FIG. 5) and a read/write board (not shown).

The conductive pattern 4 integrally includes magnetic-head-side connection terminal portions 6 (which may be hereinafter simply referred to as the "terminal portions 6") for connecting to connection terminals 26 (see FIG. 5) of a magnetic head 25, external connection terminal portions 7 for connecting to connection terminals (not shown) of the read/write board, and wires 8 for connecting the magnetic-head-side connection terminal portions 6 and the external connection terminal portions 7.

A plurality (four) of the wires 8 are provided in parallel along the longitudinal direction of the metal supporting board 2 to be arranged in mutually spaced-apart relation in a widthwise direction (perpendicular to the longitudinal direction).

A plurality (four) of the magnetic-head-side connection terminal portions 6 are provided in parallel as quadrilateral lands to be disposed at the front end portion (one longitudinal end portion) of the metal supporting board 2, and connected to the respective front end portions of the wires 8.

A plurality (four) of the external connection terminal portions 7 are provided in parallel as quadrilateral lands to be disposed at the rear end portion (the other longitudinal end portion) of the metal supporting board 2, and connected to the respective rear end portions of the wires 8. The external connection terminal portions 7 are connected to the terminal portions (not shown) of the read/write board.

As shown in FIG. 4(d), the suspension board with circuit 1 includes the metal supporting board 2, the insulating base layer 3 formed on the metal supporting board 2, the conductive pattern 4 formed on the insulating base layer 3, and the insulating cover layer, not shown, which is formed on the insulating base layer 3.

The insulating base layer 3 is formed in a pattern corresponding to the conductive pattern 4 on the surface of the metal supporting board 2.

The insulating cover layer not shown is formed to cover the wires 8 and exposes the terminal portions 6.

Next, a detailed description is given to the front end portion of the suspension board with circuit 1 with reference to FIGS. 2 and 3.

In FIG. 2, the front end portion of the suspension board with circuit 1 is formed with the terminal portions 6, a cut-out portion 10, and a mounting portion 11 as a slider mounting portion.

The terminal portions 6 are each disposed at the front end of the front end portion to be arranged in mutually spaced apart relation in the widthwise direction. The respective rear end surfaces of the terminal portions 6 are disposed to be flush with each other in the widthwise direction. The front ends of the terminal portions 6 are connected to the wires 8. That is, wires 8 are routed such that a pair of (two) wires 8A on one widthwise side, and a pair of (two) wires 8B on the other widthwise side, both of which have extended in the both widthwise end portions of the front end portion of the suspension board with circuit 1 and reached the side frontward of the terminal portions 6, are inwardly bent in the widthwise direction, and further rearwardly bent to connect to the respective front ends of the terminal portions 6.

The width (widthwise length) of each of the terminal portions 6 is in a range of, e.g., 15 to 200 μm, or preferably 50 to 100 μm. The spacing (widthwise spacing) between the individual terminal portions 6 is in a range of, e.g., 15 to 200 μm, or preferably 20 to 100 μm. Accordingly, a distance L1 between the outermost end edges of the terminal portions 6 disposed on the both widthwise outermost sides, i.e., the distance L1 between the one widthwise end edge of the terminal portion 6 on one widthwise outermost side and the other widthwise end edge of the terminal portion 6 on the other widthwise outermost side is set to a range of, e.g., 400 to 1100 μm, or preferably 500 to 1000 μm.

The cut-out portion 10 is formed in a generally U-shaped shape which is opened toward the front side when viewed in plan view. The cut-out portion 10 is formed to extend through the metal supporting board 2 in a thickness direction. The cut-out portion 10 is disposed between the pair of wires 8A on one widthwise side and the pair of wires 8B on the other widthwise side in the widthwise direction. Specifically, a margin between the cut-out portion 10 and each of the both widthwise end portions of the metal supporting board 2 is set to allow the passage of the pair of wires 8 therethrough on each of the both widthwise outer sides of the cut-out portion 10, while a margin between the cut-out portion 10 and the end edge of the front end portion of the metal supporting board 2 is set to allow the terminal portions 6 to be arranged in spaced-apart relation on the side frontward of the cut-out portion 10.

The mounting portion 11 is defined in a generally rectangular shape when viewed in plan view as a region widthwise inner than the cut-out portion 10. The mounting potion 11 is disposed in longitudinally spaced-apart and adjacent relation to the terminal portions 6. The mounting portion 11 is provided with three pedestals 12 for supporting a slider 23 (see FIG. 5).

The pedestals 12 include a first pedestal 13 and a second pedestal 14 as proximate pedestals which are proximate to the terminal portions 6, and a third pedestal 15 as a distant pedestal which is distant from the terminal portions 6.

The first pedestal 13 and the second pedestal 14 are disposed at the front end portion of the mounting portion 11, and arranged in mutually spaced-apart and opposing relation in the widthwise direction. More specifically, the first pedestal 13 and the second pedestal 14 are formed on a straight line (imaginary line) 35 along the widthwise direction (perpendicular to a direction in which the terminal portions 6 and the mounting portion 11 are adjacently arranged).

More specifically, a widthwise spacing S1 between the first pedestal 13 and the second pedestal 14 is, e.g., not less than ⅔, or preferably ⅔ to 1 of the distance L1 between the outermost end edges of the terminal portions 6 disposed on the both widthwise outermost sides mentioned above. More specifically, the widthwise spacing S1 is in a range of, e.g., 266 to 1100 μm, or preferably 300 to 1000 μm.

A middle point P between the first pedestal 13 and the second pedestal 14 is preferably disposed on a perpendicular bisector 36 between the terminal portions 6 disposed on the both widthwise outermost sides.

The longitudinal spacing between each of the first pedestal 13 and the second pedestal 14 and the terminal portions 6 is in range of, e.g., not more than 400 μm, or preferably not more than 200 μm, and normally not less than 20 μm.

The third pedestal 15 is disposed at the rear end portion of the mounting portion 11 to be spaced part from each of the first pedestal 13 and the second pedestal 14 in both the longitudinal direction and the widthwise direction.

More specifically, the third pedestal 15 is disposed between a straight line (imaginary line) 33 and a straight line (imaginary line) 34 each extending along the longitudinal direction so as to traverse the first pedestal 13 and the second pedestal 14, respectively.

Preferably, the third pedestal 15 is disposed on a perpendicular bisector 37 between the first pedestal 13 and the second pedestal 14. When the perpendicular bisector 37 passes through the middle point P mentioned above, the perpendicular bisector 37 between the first pedestal 13 and the second pedestal 14, and the perpendicular bisector 36 between the terminal portions 6 disposed on both widthwise outermost sides preferably coincide with each other to provide the same straight line.

The longitudinal spacing between the third pedestal 15 and the terminal portions 6 is within a range of, e.g., not more than 1200 μm, or preferably not more than 1000 μm, and normally not less than 250 μm.

The individual pedestals 12 may also be formed to have the same shape or different shapes. For example, each of the pedestals 12 is formed in a generally annular shape when viewed in plan view, as shown in FIGS. 2 and 3(b).

As shown in FIG. 3(a), each of the pedestals 12 is formed on the metal supporting board 2, and includes a pedestal insulating base layer 16, and the pedestal conductive layer 18 formed on the pedestal insulating baser layer 16.

As shown in FIG. 3(b), the pedestal insulating base layer 16 is formed in a generally annular shape when viewed in plan view having an opening 17 formed in the center thereof on the surface of the metal supporting board 2 in the mounting portion 11.

The pedestal conductive layer 18 is formed in a generally circular shape with a depressed center when viewed in plan view on the surface of the pedestal insulating base layer 16 and the surface of the metal supporting board 2 exposed from the opening 17 of the pedestal insulating base layer 16. The pedestal conductive layer 18 is formed on the upper surface of the pedestal insulating base layer 16 to extend continuously from the inner end portion in the diametric direction of the pedestal insulating base layer 16 to a middle point in the diametric direction, and expose the outer end portion in the diametric direction of the pedestal insulating base layer 16. The pedestal conductive layer 18 has the upper surface of the portion thereof formed on the pedestal insulating base layer 16 which is used as a supporting portion 40 for supporting the slider 23. The slider 23 is supported on the upper surface of the supporting portion 40 (see FIG. 5).

The dimensions of the pedestal conductive layer 18 and the pedestal insulating base layer 16 are as follows. For example, an outer diameter D1 of the pedestal conductive layer 18 is in a range of, e.g., 10 to 200 μm, or preferably 50 to 150 μm, an outer diameter D2 of the pedestal insulating base layer 16 is in a range of, e.g., 110 to 300 μm, or preferably 150 to 250 μm, and an inner diameter D3 of the pedestal insulating base layer 16 is in a range of 10 to 200 μm, or preferably 50 to 150 μm. When the outer diameter D1 of the pedestal conductive layer 18 or the inner diameter D3 of the pedestal insulating base layer 16 exceeds the range shown above, the slider 23 may not be supported stably.

The thickness of the pedestal insulating base layer 16 is in a range of, e.g., 1 to 20 μm, or preferably 1 to 10 μm. The thickness of the pedestal conductive layer 18 is in a range of, e.g., 3 to 50 μm, or preferably 5 to 25 μm.

In the description given above, each of the pedestals 12 is formed in an annular shape when viewed in plan view. However, the pedestal 12 can also be formed in an appropriate shape such as, e.g., a triangular frame shape or a rectangular frame shape (quadrilateral frame shape).

In the suspension board with circuit 1, the metal plating layer 30 is formed on the surface (not shown in FIG. 3(a)) of each of the terminal portions 6 and the surface of the pedestal conductive layer 18, as shown in FIG. 3(a).

Next, a description is given to a producing method of the suspension board with circuit 1 with reference to FIG. 4. First, as shown in FIG. 4(a), the metal supporting board 2 is prepared in the method.

Examples of a metal material used to form the metal supporting board 2 include stainless steel and 42-alloy. Preferably, stainless steel is used. The thickness of the metal supporting board 2 is in a range of, e.g., 15 to 30 μm, or preferably 15 to 25 μm.

Next, as shown in FIG. 4(b), the insulating base layer 3 is formed, while the pedestal insulating baser layers 16 are simultaneously formed at the front end portion.

Examples of an insulating material used to form the insulating base layer 3 and the pedestal insulating base layers 16 include synthetic resins such as a polyimide resin, a polyether nitrile resin, a polyether sulfone resin, a polyethylene terephthalate resin, a polyethylene naphthalate resin, and a polyvinyl chloride resin. Among them, a photosensitive synthetic resin is preferably used, or more preferably, a photosensitive polyimide resin is used.

To form the insulating base layer 3 and the pedestal insulating base layers 16, a varnish of the photosensitive synthetic resin, e.g., is coated on the entire surface of the metal supporting board 2, dried, exposed to light with the foregoing pattern, developed, and then cured as necessary.

Alternatively, the insulating base layer 3 and the pedestal insulating base layers 16 can also be formed in the foregoing pattern by uniformly coating a solution of the synthetic resin mentioned above on the entire surface of the metal supporting board 2, drying the solution, curing it as necessary by heating, and then performing etching or the like. Otherwise, the insulating base layer 3 and the pedestal insulating base layers 16 can also be formed by, e.g., forming the synthetic resin into a film in the foregoing pattern in advance, and sticking the film to the surface of the metal supporting board 2 via a known adhesive layer.

The thicknesses of the insulating base layer 3 and the pedestal insulating base layers 16 thus formed are in a range of, e.g., 1 to 20 μm, or preferably 1 to 10 μm.

Next, as shown in FIG. 4(c), the conductive pattern 4 is formed, and the pedestal conductive layers 18 are simultaneously formed at the front end portion.

Examples of a conductive material used to form the conductive pattern 4 and the pedestal conductive layers 18 include copper, nickel, gold, a solder, and an alloy thereof Among them, copper is preferably used.

To form the conductive pattern 4 and the pedestal conductive layers 18, a known patterning method such as, e.g., an additive method or a subtractive method is used. Preferably, an additive method using electrolytic plating is used.

In the additive method, a conductive seed film, e.g., is formed first on the surface of the metal supporting board 2 including the surface of the insulating base layer 3 and the surface of each of the pedestal insulating base layers 16 by a sputtering method or the like. Then, a plating resist is formed in a pattern reverse to the conductive pattern 4 and to the pattern of the individual pedestal conductive layers 18 on the conductive seed film. Thereafter, the conductive pattern 4 and each of the pedestal conductive layers 18 are formed on the conductive seed film exposed from the plating resist by electrolytic plating supplied with power from the metal supporting board 2 exposed from the insulating base layer 3 and from the metal supporting board 2 exposed from the opening 17 of the pedestal insulating base layer 16. Thereafter, the plating resist and the portion of the conductive seed film where the plating resist is laminated are removed.

The thicknesses of the conductive pattern 4 and the pedestal conductive layers 18 thus formed are in a range of, e.g., 3 to 50 μm, or preferably 5 to 25 μm.

Next, the insulating cover layer is formed, though not shown. As an insulating material used to form the insulating cover layer, the same insulating material as used to form the insulating base layer 3 and the pedestal insulating base layers 16 mentioned above can be listed.

To form the insulating cover layer, a varnish of the photosensitive synthetic resin, e.g., is coated on the entire surface of the insulating baser layer 3, dried, exposed to light with the foregoing pattern, developed, and then cured as necessary.

Alternatively, the insulating cover layer can also be formed in the foregoing pattern by uniformly coating a solution of the synthetic resin mentioned above on the entire surface of the insulating base layer 3, drying the solution, curing it as necessary by heating, and then performing etching or the like. Otherwise, the insulating cover layer can also be formed by, e.g., forming the synthetic resin into a film in the foregoing pattern in advance, and sticking the film to the surface of the insulating baser layer 3 via a known adhesive layer.

In this manner, the insulating cover layer covering the wires 8 is formed on the insulating base layer 3.

The thickness of the insulating cover layer thus formed is in a range of, e.g., 2 to 25 μm, or preferably 5 to 15 μm.

Next, the metal plating layers 30 (FIG. 3(*a*)) are formed on the surfaces of the terminal portions 6 and the surfaces of the pedestal conductive layers 18, though not shown in FIG. 4. The metal plating layers 30 are made of a metal material such as gold or nickel. The metal plating layers 30 are formed by, e.g., electrolytic plating supplied with power from the metal supporting board 2 or electroless plating. Preferably, the metal plating layers 30 are formed by electrolytic plating such as electrolytic gold plating or electrolytic nickel plating. The thicknesses of the metal plating layers 30 thus formed are in a range of, e.g., 0.2 to 5 μm, or preferably 0.5 to 3 μm.

Next, as shown in FIG. 4(*d*), the metal supporting board 2 is cut out by chemical etching to form the cut-out portion 10, while being trimmed, whereby the suspension board with circuit 1 is obtained.

Next, a description is given to a method for mounting the slider 23 on the obtained suspension board with circuit 1, and connecting the connection terminals 26 of the magnetic head 25 and the terminal portions 6 with reference to FIG. 5.

The magnetic head 25 has the connection terminals 26 which are each formed in the shape of a generally rectangular thick flat plate when viewed in plan view to connect to the terminal portions 6, and is mounted on the front end portion of the slider 23.

First, in the method, a known adhesive is laminated as necessary on the center of the mounting portion 11 when viewed in plan view, though not shown.

Then, the slider 23 is placed on the mounting portion 11 such that the lower surface of the slider 23 comes in contact with the upper surface (upper surface of the metal plating layer 30) of the supporting portion 40 of each of the pedestals 12. The slider 23 is placed such that the connection terminals 26 of the magnetic head 25 are disposed in the vicinity of the terminal portions 6 when viewed in plan view.

As a result, the lower surface of the slider 23 is supported on the pedestals 12, while the lower surface of the portion of the slider 23 which is not in contact with the pedestals 12 is fixed by the adhesive, so that the slider 23 is mounted on the mounting portion 11.

Then, a solder ball 24 (broken line) is formed between each of the connection terminals 26 of the magnetic head 25 and the corresponding terminal portion 6 such that the connection terminal 26 and the terminal portion 6 are electrically connected via the solder ball 24. The solder ball 24 is formed of a known solder material.

In this manner, the connection terminals 26 of the magnetic head 25 and the terminal portions 6 are electrically connected.

Since the suspension board with circuit 1 is provided with the three pedestals 12, the slider 23 can be supported at three points by these pedestals 12. This allows the slider 23 to be supported in a stable position. As a result, it is possible to maintain the slider 23 in a steady floating position (angle).

In the suspension board with circuit 1, even when the pedestals 12 formed by electrolytic plating have different thicknesses, the slider 23 can be supported in a stable position by three-point mounting.

In addition, since the three pedestals 12 are provided in spaced-apart relation in the suspension board with circuit 1, the pedestals 12 having the same thickness can be formed by electrolytic plating.

In the suspension board with circuit 1, when the slider 23 is mounted on the pedestals 12, and the magnetic head 25 is further mounted on the slider 23 to electrically connect the terminals portions 6 and the connection terminals 26 of the magnetic head 25, the positions of the connection terminals 26 of the magnetic head 25 with respect to the terminal portions 6 can be more stabilized with the first pedestal 13 and the second pedestal 14 which are proximate to the terminal portion 6. This allows more precise connection between the terminal portions 6 and the connection terminals 26 of the magnetic head 25. As a result, the connection reliability of the suspension board with circuit 1 can be improved.

Further, in the suspension board with circuit 1, the magnetic head 25 is disposed at the optimum position to allow efficient stabilization of the floating position of the slider 23.

In the description given above, each of the pedestals 12 is formed in a generally annular shape when viewed in plan view. However, it is also possible to form the pedestal 12 in, e.g., a generally disk shape when viewed in plan view, as shown in FIG. 6.

Figure 6:
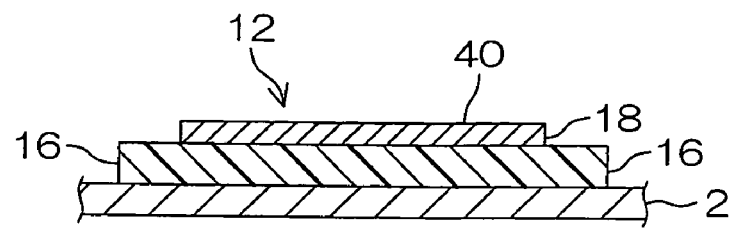
FIG. 6 is an enlarged cross-sectional view of the pedestal provided at the front end portion of the suspension board with circuit according to another embodiment (in which the pedestal has a generally disk shape when viewed in plan view) of the present invention.

That is, in FIG. 6, the pedestal insulating base layer 16 is not formed with the opening 17 (see FIG. 3), but is formed in a flat plate or disk shape when viewed in plan view.

The pedestal conductive layer 18 is formed in a flat plate or generally disk shape when viewed in plan view on the surface of the pedestal insulating base layer 16.

It is also possible not to provide the metal plating layers 30 (FIG. 3(*a*)) on the surfaces of the pedestal conductive layers 18 of the pedestals 12. The metal plating layers 30 can also be provided on the surfaces of the pedestal conductive layers 18, though not shown in FIG. 6. In the case of providing the metal plating layers 30, they are formed by, e.g., electroless plating or the like.

Since each of the pedestals 12 is formed in a flat plate or generally disk shape when viewed in plan view in the suspension board with circuit 1, the slider 23 can be reliably supported.

Preferably, the pedestal 12 is formed in a generally annular shape when viewed in plan view, as shown in FIG. 3(a). When the pedestal 12 is formed in a generally annular shape when viewed in plan view, the metal plating layers 30 can be easily formed by electrolytic plating supplied with power from the metal supporting board 2 since the depressed portion 19 of the pedestal conductive layer 18 is in contact with the metal supporting board 2.

EXAMPLES

The present invention is described more specifically by showing the example and the comparative example hereinbelow. However, the present invention is by no means limited to the example and the comparative example.

Example 1

A metal supporting board made of a stainless steel foil with a thickness of 20 μm was prepared (see FIG. 4(a)).

Then, a varnish of a photosensitive polyamic acid resin was coated on the entire surface of the metal supporting board, dried, and exposed to light via a photomask, heated, developed, and then cured to simultaneously form an insulating base layer and pedestal insulating base layers on the metal supporting board (see FIG. 4(b)).

The thickness of each of the insulating base layer and the pedestal insulating base layers was 10 μm. Each of the pedestal insulating base layers was formed in an annular shape when viewed in plan view with an outer diameter of 199 μm, and an inner diameter of 105 μm.

Then, a conductive seed film made of a chromium seed film with a thickness of 30 nm and a copper thin film with a thickness of 70 nm was formed on the surface of the metal supporting board including the surface of the insulating base layer and the surfaces of the pedestal insulating base layers by a sputtering method. Subsequently, a plating resist was formed in a pattern reverse to a conductive pattern and the pattern of individual pedestal conductive layers on the conductive seed film. Then, the conductive pattern and the pedestal conductive layers, each made of copper, were formed on the conductive seed film exposed from the plating resist by electrolytic plating supplied with power from the metal supporting board (see FIG. 4(c)). Thereafter, the plating resist and the portion of the conductive seed film where the plating resist was laminated were removed.

In this manner, three pedestals including the pedestal insulating base layers and the pedestal conductive layers were formed.

The thickness of each of the conductive patterns and the pedestal conductive layers was 10 μm. The width of each of terminal portions of the conductive pattern was 80 μm, and the spacing between the individual terminal portions was 50 μm. The distance between the outermost end edges of the terminal portions disposed on the both widthwise outermost sides was 730 μm. The middle point between the first pedestal and the second pedestal was disposed on a perpendicular bisector between the terminal portions disposed on the both widthwise outermost sides.

The spacing between each of the first pedestal and the second pedestal and the terminal portions was 120 μm. The widthwise spacing between the first pedestal and the second pedestal was 590 μm (i.e., 2.42/3 of the distance between the outermost end edges of the terminal portions disposed on the both widthwise outermost sides). The longitudinal spacing between the third pedestal and the terminal portions was 970 μm.

Each of the pedestals was formed in an annular shape when viewed in plan view, and the outer diameter of each of the pedestal conductive layers was 140 μm.

Then, a varnish of a photosensitive polyamic acid resin was coated on the surface of the insulating base layer, dried, exposed to light via a photomask, heated, and then developed to form an insulating cover layer in the foregoing pattern. The thickness of the insulating cover layer was 5 μm.

Then, metal plating layers made of gold with a thickness of 2 μm were formed on the surfaces of the pedestal conductive layers and the surfaces of the terminal portions by electrolytic gold plating (see FIG. 3(a)).

Thereafter, the metal supporting board was cut out by wet etching to form a cut-out portion, while being trimmed, whereby a suspension board with circuit was obtained (see FIG. 4(d)).

Comparative Example 1

A suspension board with circuit was obtained in the same manner as in EXAMPLE 1 except that the three pedestals were changed to a single large pedestal.

Figure 7:
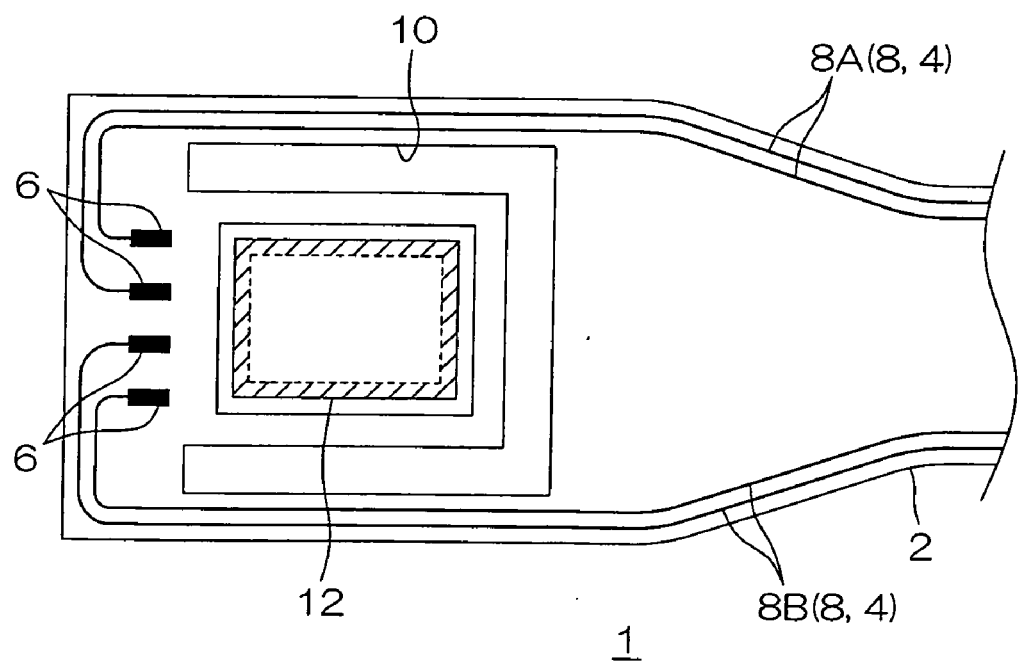
FIG. 7 is an enlarged plan view of the front end portion of a suspension board with circuit according to COMPARATIVE EXAMPLE 1.

That is, as shown in FIG. 7, the pedestal insulating base layer was formed in a rectangular frame shape when viewed in plan view in a mounting portion to continue along each of the sides of the mounting portion. The widthwise length of the pedestal insulating base layer was 790 μm, the longitudinal length thereof was 925 μm, and the width thereof at each of the sides was 70 μm.

Further, the pedestal conductive layer was formed in a rectangular shape when viewed in plan view which exposes the outer end portion of the pedestal insulating base layer having a size of 40 μm, whereby the single pedestal in a rectangular frame shape when viewed in plan view was formed.

(Evaluation)
(1) Measurement of Thickness

The difference between the maximum thickness and the minimum thickness of each of the pedestals of the suspension boards with circuits obtained in EXAMPLE 1 and COMPARATIVE EXAMPLE 1 was measured.

As a result, the difference between the maximum thickness and the minimum thickness of the pedestal was about 0.3 μm in the suspension board with circuit of EXAMPLE 1. By contrast, the difference between the maximum thickness and the minimum thickness of the pedestal was about 1 μm in the suspension board with circuit of COMPARATIVE EXAMPLE 1.

(2) Mounting of Slider

In each of the suspension boards with circuits obtained in EXAMPLE 1 and COMPARATIVE EXAMPLE 1, an adhesive was coated on the center of the mounting portion, and then a slider was supported by the pedestals or pedestal to be fixed.

As a result, the slider was maintained in a stable position in EXAMPLE 1. By contrast, the slider wobbled and could not be maintained in a stable position in COMPARATIVE EXAMPLE 1.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with a circuit comprising: a slider mounting portion provided with only three pedestals arranged in mutually spaced apart relation for supporting a slider on which a magnetic head is mounted, wherein each of the three pedestals has a circular outline in shape when viewed in a plan view, such that the three pedestals unitarily determine an arbitrary plane based on three points of contact with the slider.

2. The suspension board with the circuit according to claim 1, wherein each of the pedestals is formed by electrolytic plating.

3. The suspension board with the circuit according to claim 1, further comprising:
 a terminal portion disposed adjacent to the slider mounting portion to electrically connect to the magnetic head,
 wherein the pedestals include:
 two proximate pedestals which are proximate to the terminal portion; and
 a distant pedestal which is distant from the terminal portion.

4. The suspension board with the circuit according to claim 3,
 wherein each of the proximate pedestals is disposed on a straight line extending in a direction perpendicular to a direction in which the slider mounting portion and the terminal portion are adjacently arranged, and
 the distant pedestal is disposed between straight lines each extending along the direction in which the slider mounting portion and the terminal portion are adjacently arranged so as to traverse the respective proximate pedestals.

5. The suspension board with the circuit according to claim 1, wherein the circular outline comprises a generally annular shape when viewed in the plan view.

6. The suspension board with the circuit according to claim 1, wherein the circular outline comprises a generally disk shape when viewed in the plan view.

7. The suspension board with the circuit according to claim 5, wherein each of the three pedestals comprises a generally annular insulating base layer having an opening formed in a center thereof, and a generally circular conductive layer with a depressed center, the conductive layer being formed on at least an upper surface of the insulating base layer.

8. The suspension board with the circuit according to claim 7, further comprising a metal plating layer formed on at least an upper surface of the conductive layer.

9. A suspension board with a circuit comprising: a slider mounting portion provided with three pedestals arranged in mutually spaced apart relation for supporting a slider on which a magnetic head is mounted, wherein each of the three pedestals has a circular outline in shape when viewed in a plan view, wherein the circular outline comprises a generally annular shape when viewed in the plan view, and wherein each of the three pedestals comprises a generally annular insulating base layer having an opening formed in a center thereof, and a generally circular conductive layer with a depressed center, the conductive layer being formed on at least an upper surface of the insulating base layer.

* * * * *